United States Patent
Chang et al.

(10) Patent No.: US 8,008,158 B2
(45) Date of Patent: Aug. 30, 2011

(54) DOPANT IMPLANTATION METHOD USING MULTI-STEP IMPLANTS

(75) Inventors: Tse-En Chang, Hsinchu (TW); Chih-Fu Chang, Neipu Township (TW); Bone-Fong Wu, Hsinchu (TW); Chieh Chih Ting, Hsinchu (TW); Shao Hua Wang, Hsinchu (TW); Pu-Fang Chen, Hsinchu (TW); Yen Chuang, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 419 days.

(21) Appl. No.: 12/170,656

(22) Filed: Jul. 10, 2008

(65) Prior Publication Data
US 2010/0009506 A1    Jan. 14, 2010

(51) Int. Cl.
*H01L 21/336* (2006.01)
*H01L 21/8236* (2006.01)

(52) U.S. Cl. ........ 438/306; 438/276; 438/278; 438/289; 438/301; 438/305; 438/307

(58) Field of Classification Search .................. 438/306, 438/305, 307
See application file for complete search history.

(56) References Cited

U.S. PATENT DOCUMENTS

| | | | | |
|---|---|---|---|---|
| 5,719,425 A * | 2/1998 | Akram et al. | ................. | 257/344 |
| 6,096,616 A * | 8/2000 | Nistler et al. | ................. | 438/305 |
| 6,235,599 B1 * | 5/2001 | Yu | .................................. | 438/305 |
| 6,580,149 B2 | 6/2003 | Tran et al. | | |
| 7,291,535 B2 * | 11/2007 | Niwayama et al. | ........... | 438/302 |
| 2005/0156236 A1 * | 7/2005 | Nandakumar et al. | ........ | 257/344 |
| 2005/0181567 A1 * | 8/2005 | Fischer et al. | ................ | 438/307 |
| 2006/0216900 A1 * | 9/2006 | Wang et al. | .................... | 438/306 |

OTHER PUBLICATIONS

Liefting et al., Improved Device Performance by Multistep or Carbon Co-Implants, IEEE Transactions on Electron Devices, vol. 41, No. 1, Jan. 1994, pp. 50-55.

* cited by examiner

*Primary Examiner* — N Drew Richards
*Assistant Examiner* — Michael Jung
(74) *Attorney, Agent, or Firm* — Duane Morris LLP

(57) ABSTRACT

A method of forming a dopant implant region in a MOS transistor device having a dopant profile having a target dopant concentration includes implanting a first concentration of dopants into a region of a substrate, where the first concentration of dopants is less than the target dopant concentration, and without annealing the substrate after the implanting step, performing at least one second implanting step to implant at least one second concentration of dopants into the region of the substrate to bring the dopant concentration in the region to the target dopant concentration.

16 Claims, 7 Drawing Sheets

DOPANT IMPLANTATION METHOD USING MULTI-STEP IMPLANTS

FIELD OF THE INVENTION

The present invention relates to manufacturing of integrated circuits, and more particularly to methods of implanting dopants during integrated circuit manufacturing.

BACKGROUND OF THE INVENTION

Integrated circuit manufacturers have relied an two principal approaches to improving integrated circuit chip performance relating to speed and stand-by leakage current (Iddq). Device regions, such as source and drain regions in a MOS transistor device are formed by implanting dopants into a semiconductor substrate. In one approach, the implant energy (and thus implant depth) and/or implant dosage of the implantation step used to form these device regions is adjusted to change the doping profile of the MOS devices in the IC, thereby optimizing the transistors' DC and AC parameters. In a second approach, other design or process parameters, such as materials, thermal budget, etc. are modified or adjusted to obtain the desired IC chip performance.

Changing the dopant profile can result in significant DC/AC parametric changes. This approach is unacceptable for existing products that cannot afford SPICE model changes to the silicon. Changing other parameters, such as materials, thermal budget, etc., usually leads to increased cost and cycle time and can require circuit redesign, all of which are undesirable.

Methods for enhancing device performance are desired.

SUMMARY OF THE INVENTION

A method of forming a dopant implant region in a MOS transistor device having a dopant profile having a target dopant concentration includes implanting a first concentration of dopants into a region of a substrate, where the first concentration of dopants is less than the target dopant concentration, and without annealing the substrate after the implanting step, performing at least one second implanting step to implant at least one second concentration of dopants into the region of the substrate to bring the dopant concentration in the region to the target dopant concentration.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

Figure 1:
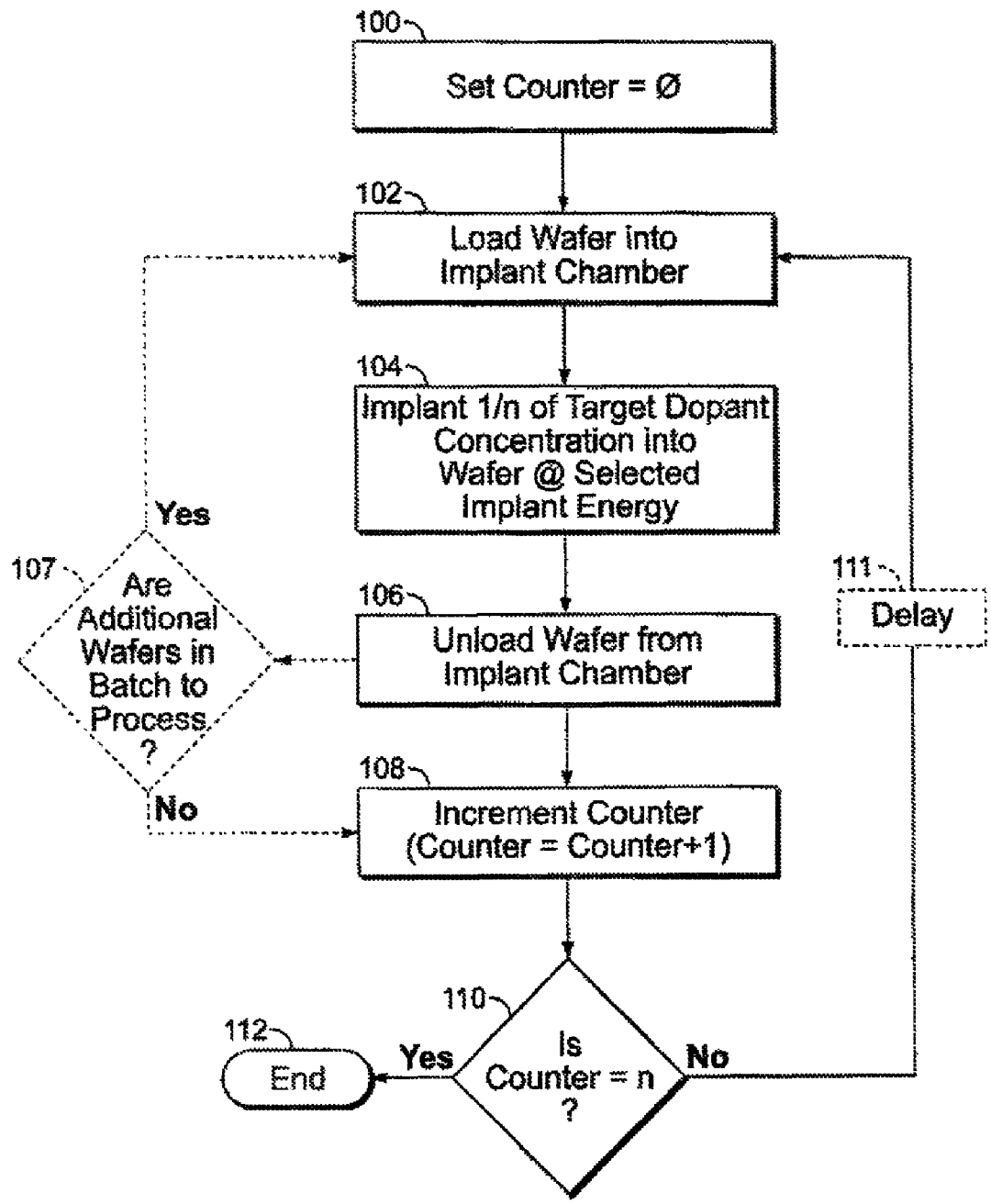
FIG. 1 is a flow diagram of an exemplary implantation process according to an embodiment of the present invention.

An improved ion implantation method for forming implant dopant regions in MOS transistors formed in a semiconductor substrate is described herein. In exemplary embodiments, the implantation method is used to form the lightly doped drain (LDD) regions underlying the MOS transistor gate, the remaking portions of the source/drain regions of the MOS device and the halo implant, though the concepts described herein can also be utilized in formation of other device regions, such as wells, sinkers, plugs, extensions or other implant regions, or even in forming other devices in a semiconductor substrate.

As will be familiar to those familiar with the manufacture of ICs having MOSFET devices, a semiconductor substrate is provided with a gate structure formed on its surface, thereby defining a charmed region in the substrate beneath the gate having a source side and drain side. Next, lightly doped LDD regions are formed adjacent to the channel region by ion implantation of dopant species in the substrate. Then, insulating spacers of a first width are formed adjacent to the sidewalls of the gate structure covering at least a portion of each of the LDD regions. Next, portions of the wafer to be protected from implantation (e.g., the memory array portion of a DRAM circuit) are masked and heavily-doped source/drain regions are formed in the unmasked periphery MOSFETS by ion implantation in the substrate. The mask is then removed, and the insulating spacers are etched back to a second width smaller than the first width. In the DRAM example, double LDD regions are formed by lightly doping the substrate in the memory array and in the periphery MOSFET areas. In this process, the implantation method described herein can be used to form the LDD regions and the move heavily doped portions of the source/drain regions.

Use of the improved implant method described herein produces an IC device having improved device performance in, for example, device speed and standby leakage current (Iddq). The improved device exhibits lower overlap capacitance (Cov) between the gate and LDD regions, no significant change in the source-drain resistance (Rsd), better short channel effect (SCE) control, and good junction leakage performance, with very little if any impact on the SPICE model of the device and cost.

In all implant procedures, a target dopant concentration is selected for the implant region (e.g., LDD) to be formed. The desired dopant profile is created by implanting the target dopant concentration of a dopant species to a target depth, which is controlled in part by the implant energy setting used for the implantation step. In the improved process described herein, rather than implanting the entire target dopant concentration in one implantation into the region, two or more separate implantations are employed on the same region to form the dopant profile where each implant step implants a dopant concentration lower than the total target dopant concentration. Two or more separate implant operations are performed until the sum of the implanted dopants in the region equals the target dopant concentration. This process is described in more detail in connection with the flow chart of FIG. 1.

At step 100, a COUNTER value is set to 0. This COUNTER can be manually set or kept or automatically kept by the controller of the ion implanter used to perform the implantation. Examples of such ion implanters that may be used to perform the implantation include, by way of example only, the QUANTUM™ X ion implanter from Applied Materials or the VIISta® implanter from Varian Semiconductor Equipment.

At step 102, a semiconductor wafer, such as a silicon wafer upon which an integrated circuit is to be manufactured, is loaded into the implant chamber of the ion implanter, as is conventional prior to implanting dopants into a substrate.

As described above, the target dopant profile to be created in the wafer has a target dopant concentration, typically measured in atoms/cm$^3$, and is associated with an implant energy, typically measured in keV, which determines the implant depth. Rather than implant the entire implant dosage in one implantation step, multiple implant steps are performed where each implantation step implants only a portion of the total dopant concentration into the defined implant region, with the sum total of the individual implant dosages producing the target dopant concentration. In FIG. 1, "n" represents the total number of individual lower dosage implant steps that is employed in forming the dopant profile. The total number of implant steps is at least two, and in exemplary embodiments three to five, though embodiments using a greater number of implant steps are contemplated.

As shown in step 104, 1/n of the target dopant concentration is implanted into the wafer at the implant energy selected for the desired depart profile. For example, if n is 5, and the target dopant concentration is $5 \times 10^{16}$ atoms/cm$^3$, then the implant at step 104 is one fifth of $5 \times 10^{16}$ atoms/cm$^3$, i.e., $1 \times 10^{16}$ atoms/cm$^3$. As will be understood by those in the art, controlling the implantation of a lower dopant concentration involves using a lower beam current, which in turn allows for better implant uniformity and low dosage control.

At step 106, the wafer is unloaded from the implant chamber. By unloading the wafer, the wafer is exposed to ambient air and temperature. If multiple wafers are being processed individually but as part of the same batch, as illustrated by decision step 107, each of the wafers is operated on by steps 102, 104 and 106 before the process proceeds to step 108. At step 108, the COUNTER value is incremented by 1 (i.e., COUNTER=COUNTER+1). At step 110, if after step 108 COUNTER equals n, then the process ends at step 112. However, if the COUNTER does not equal n, then the process returns to step 102 and the wafer is loaded back into the implant chamber for processing. This loop (steps 102, 104, 106, 108) is completed until "n" number of implant steps are performed on each wafer.

Although the dosage used at step 104 is illustrated as being 1/n of the target dosage during each implantation, other dosage values, not necessarily the same each time but each less than the target dopant concentration could be used as long as the sum of the implantation provides the target dopant concentration.

The delay between implantations on an individual wafer at step 104, more specifically the time during which the wafer is exposed to the ambient environment during step 106, is preferably at least about 4 seconds, roughly the time it takes for the machine to unload and reload the wafer from the chamber. If multiple wafers from a batch are being individually processed, this minimum delay is provided by the time it takes to process the remaining wafers before returning to a given wafer for its second, third, etc. implantation. Wafers that are awaiting implantation, or awaiting subsequent implantation, are stored in the loadlock portion of the implanter machine. If a single wafer is being processed, optionally, an intentional delay step 111 can be provided before reloading the wafer at step 102 or before subsequent rounds of implantation of the wafer at step 104.

Although not wishing to be limited to any specific theory, it is believed that the wafer unloading/reloading steps allows the wafer time to cool in between implants and/or adds to the relaxation time for the implant, and thereby provides an improved device as described herein. In any event, it has been found that a method that utilizes the wafer unloading/reloading steps produces better results than simply leaving the wafer in the implant chamber and delaying in between implantation steps, at least with certain dopant species.

Figure 2:
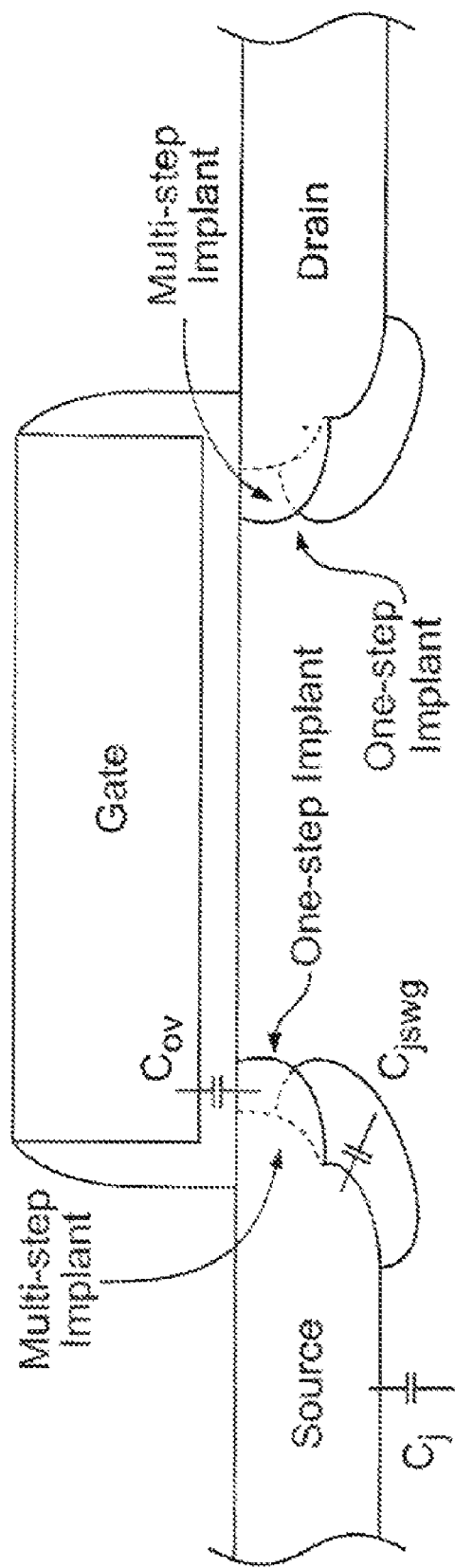
FIG. 2 is a cross-sectional view illustrating an improved implant region in a transistor manufactured using an exemplary implantation process as described in connection with FIG. 1.

FIG. 2 illustrates the implant profile change in a MOS transistor realized using a multi-step implant process as described above in connection with FIG. 1. As will be familiar to those in the art of semiconductor devices, the transistor has a gate region overlying a channel formed between source and drain implant regions. Each source and drain implant region is formed from an initial lightly doped region, which partially overlaps the gate and then a more heavily doped region that is self-aligned to the spacers adjacent the gate. Various capacitances are illustrated in the figures, including the overlap capacitance (Cov) between the gate and the source or drain region, the junction capacitance (Cj) and the capacitance between the source or drain region and its halo implant region (Cjswg). In FIG. 2, the dashed line illustrates the lightly doped portion of the source/drain regions and halo implant region formed using a multi-step implant process as described above, whereas the solid line illustrates an LDD implant region and adjacent halo implant region formed by a conventional one-step implant process by which the full target dopant concentration for these regions is implanted in a single implantation.

As is shown in FIG. 2, the multi-step implant process described above results in less overlap between the source/drain regions and the gate. This improvement in gate-to-LDD overlap results in a smaller overlap capacitance (Cov), longer effective channel length and better short channel effect (SCE) control, all with no degradation in Rsd (source/drain resistance) or Ion-Ioff, no real impact on the SPICE model or production costs and minor if any impact on junction leakage. Importantly, no equipment changes are required. These effects are described in more detail below.

While not wanting to be limited to any one theory, it is believed that the multi-step implant process results in fewer dislocations in the silicon lattice (i.e., breaks in the dopant profile) due to implant damage, when compared to devices formed by a single implantation for implanting the entire target dopant concentration of a region at the same implant energy setting. Prior art methods require an annealing step to correct these defects, but all defects cannot be corrected, resulting in some dislocations. Implantation steps using lower dosages as described herein produce fewer dislocations and, at least in some embodiments. Annealing steps are not require in between implantations but may be used after completion of the final implantation as is conventional in formation of some dopant profiles, such as the LDD regions of an NMOS device. Fewer dislocation results in reduced transient enhanced diffusion (TED) effect observed during the post-implantation drive-in annealing, especially for p-doped LDDs.

A shallower and more abrupt junction can also be produced using the multi-step implantation, which provides lower junction leakage current for NMOS devices and only slightly higher, if higher at all, junction leakage far PMOS devices, at least when Boron is used as the dopant. The shallower and more abrupt junction provides less gate-to-source/drain overlap, which results in lower off-state gate leakage (Jgof) and smaller overlap capacitance. The shallower and more abrupt junction increases the effective channel length for the PMOS device, which decreases the saturation current (Isat) and provides better short channel effect (SCE) control. The improvement in the AC performance due to the smaller overlap capacitance offsets any DC losses due to the decreased Isat, with no net change in device speed due to these factors. However, the decreased Isat provides a decrease in Isof—the subthreshold leakage entreat or source-to-drain leakage current in as OFF state transistor—in PMOS devices, and better SCE control provides for better saturation current, threshold voltage and off-state leakage current uniformity (IDU/VTU/IoffU). In the end, these factors coupled with the lower Jgof result in reduced Iddq at the same speed and, surprisingly, better Iddq uniformity across the chip.

With respect to Iddq uniformity, the results were more pronounced for devices having p-doped LDD regions formed using the multi-step implant process than for devices having n-doped LDD regions formed using the multi-step implant process. Also, forming the LDD regions using the multi-step implant method appears to have more of an effect than forming the halo (PKT) implant region using the multi-step implant method, though forming the halo implant region using the method has benefits. Further, with respect to Iddq reduction, the improvements were more pronounced with higher number of implant steps for forming the LDD and PKT implants, e.g., implanting the target dopant concentration with five implantation steps produced better results than forming the same dopant profile with three implantations.

Other approaches to improving device speed and Iddq fail in at least one important respect. For example, decreasing the LDD dose overall results in degradation in Rsd (Ion-Ioff). Decreasing LDD implant energy without a dosage change also results in undesirable Rsd (Ion-Ioff) changes and higher junction leakage and has a non-negligible SPICE impact. Decreasing LDD implant energy with a dosage increase results in higher junction leakage and has a non-negligible SPICE impact. Finally, using offset spacers with deeper and/or heavier LDD implants has a non-negligible SPICE impact with significant extra cost.

The multi-step implant process was successfully tested with processes used to form existing products. More specifically, the implant process used to form the existing products was performed using three, four and five step implant processes as described above. The original beam current of approximately 6-8/3-5 mA for N/P LDD was adjusted to 2-6 mA for NLLD and 1-3 mA for P LDD. Approximately 15 minutes was allowed in between each implant step. The implant species for the P LDD was Boron and the implant species for the N LDD was arsenic. One 65 nm product showed a 20-30% Iddq mean reduction and a 30-40% Iddq uniformity improvement at the same speed, with a 5% gain in speed at the same Iddq, using five separate implantations to form the LDD. Tests on other products showed about a 30% Iddq reduction, about 40% Iddq in-wafer uniformity improvement using three implantation steps and about 50% Iddq in-wafer uniformity using four implantation steps, and a 4-10% speed gain at the same Iddq over devices formed using a single implantation.

Figure 3:
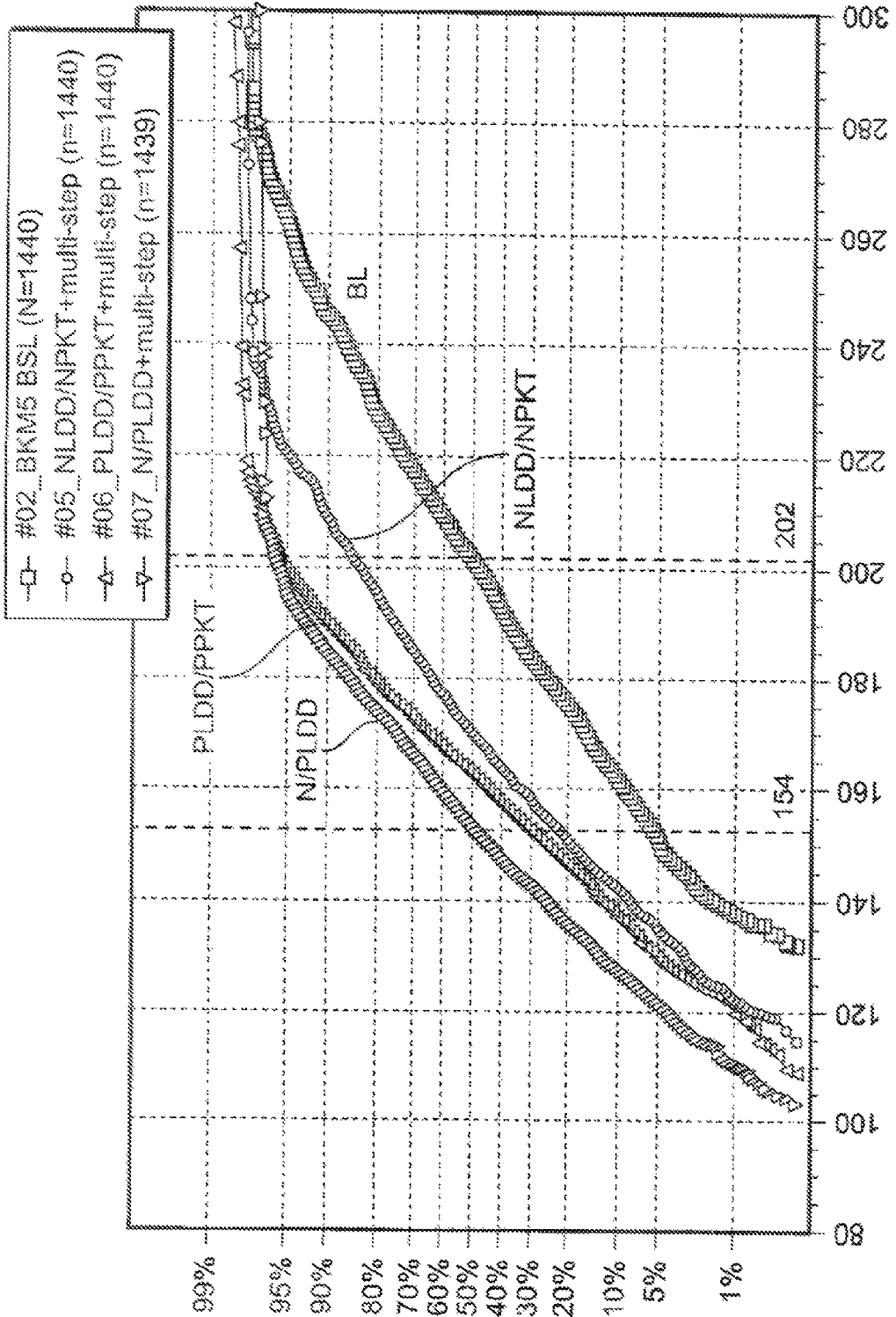
FIGS. 3-7 are graphs showing test data comparing devices formed using a multi-step implantation process, such as shown in FIG. 1, and those formed using standard single step implantation methods.

Some of these results are illustrated in the test data shown in FIGS. 3-7. For example, FIG. 3 is a cumulative percentage graph comparing various LDD/PKT implantations. The data labeled "BL" represents the baseline data from a device having implant regions formed with the standard single-step implantation. The remaining data corresponds to devices formed with multiple implantations for implanting the target dopant concentration, as described above, as follows: (i) the data labeled "PLDD/PPKT" corresponding to a device having P-doped LDD and P-doped PKT regions formed using the multi-step implant procedure; (ii) with the data labeled "N/PLDD" having N and P-doped LDD regions formed using the multi-step implant procedure; and (iii) with the data labeled "NLDD/NPKT" having N-doped LDD and N-doped PKT regions formed using the multi-step implant procedure. As can be seen in FIG. 3, for each of the devices having implant regions formed using the multi-step implant process the median value for Iddq fell left of the median value for the baseline data, meaning the median Iddq value was lower. Also, the curve for each device having an implant region formed using the multi-step implant process appears tighter than that for the baseline device, meaning the distribution was more compact. The graph also reveals that forming the PLLD implantations using the multi-step implantation method has a greater affect than forming NLDD implantations using the method, though each provides better results than forming the respective region by a conventional single step implantation.

Figure 4:
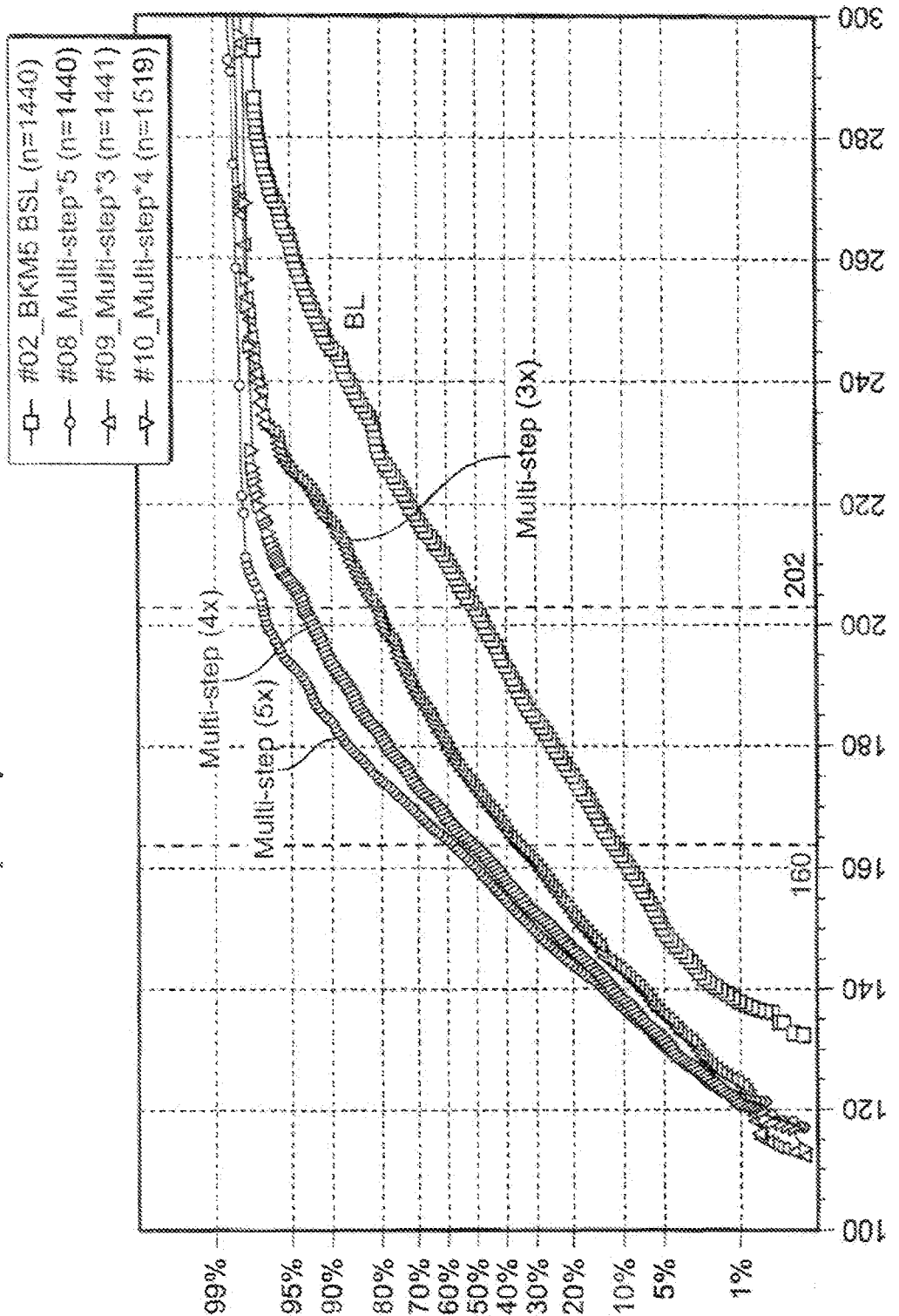

FIG. 4 is another cumulative percentage graph of Iddq and compares the results for a baseline (i.e. single implantation step) device against those formed using three-step, four-step and five-step implantations. This graph shows that, at least when comparing three, four and five-step implantations, improvements are realized with more implantation steps.

Figure 5:
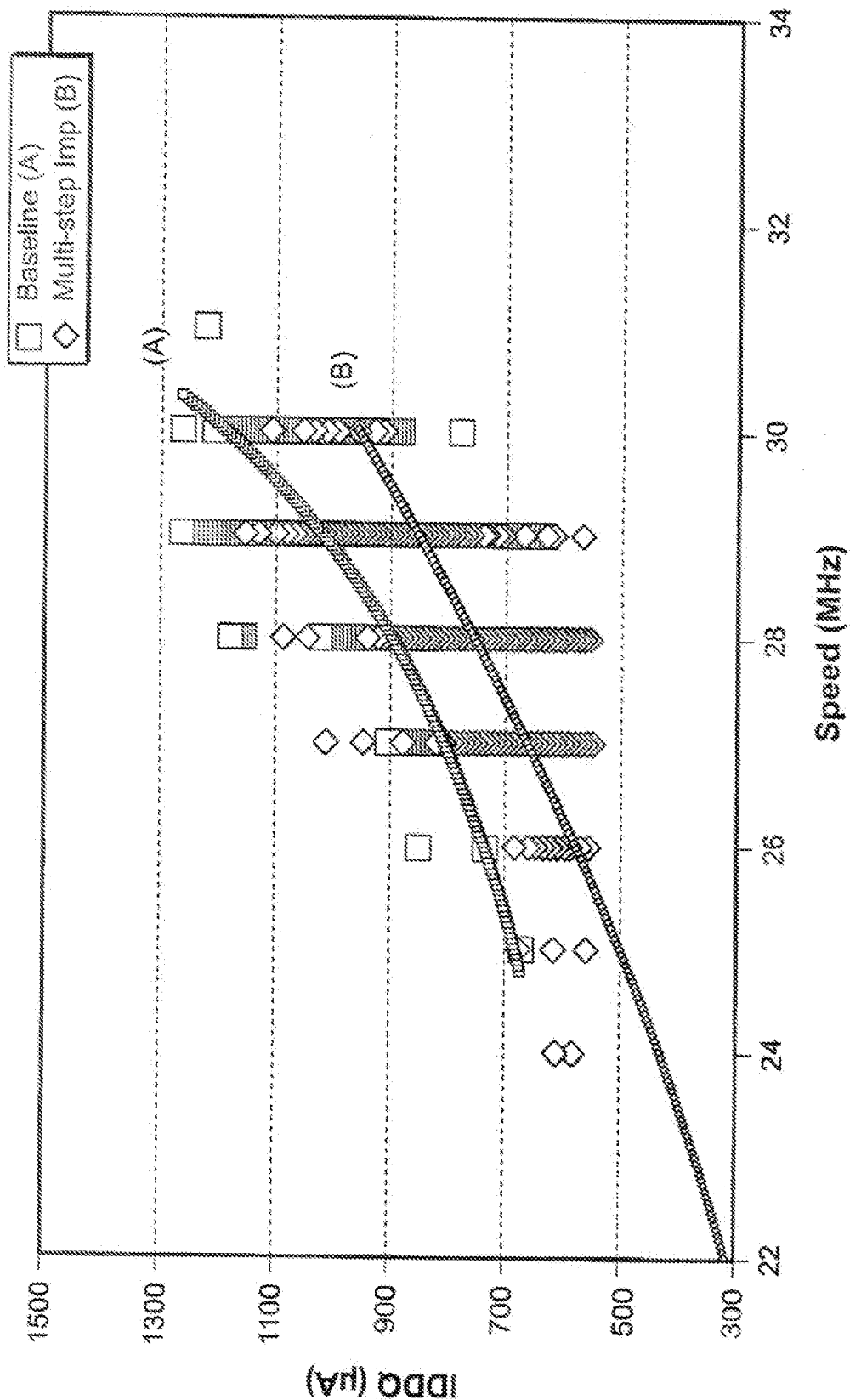

FIG. 5 is a graph comparing device speed (in MHz) against Iddq (in µA). Again, the baseline (labeled A) represents data from a device formed using the standard single step implantation for the target dopant concentration. The other data points represent data for a device formed using a multi-step implant process (labeled B). As can be seen from the graph, at the same speed, the devices formed using the multi-step implantation method have significant reductions in Iddq, and at the same Iddq, significant improvements in speed.

Figure 6:
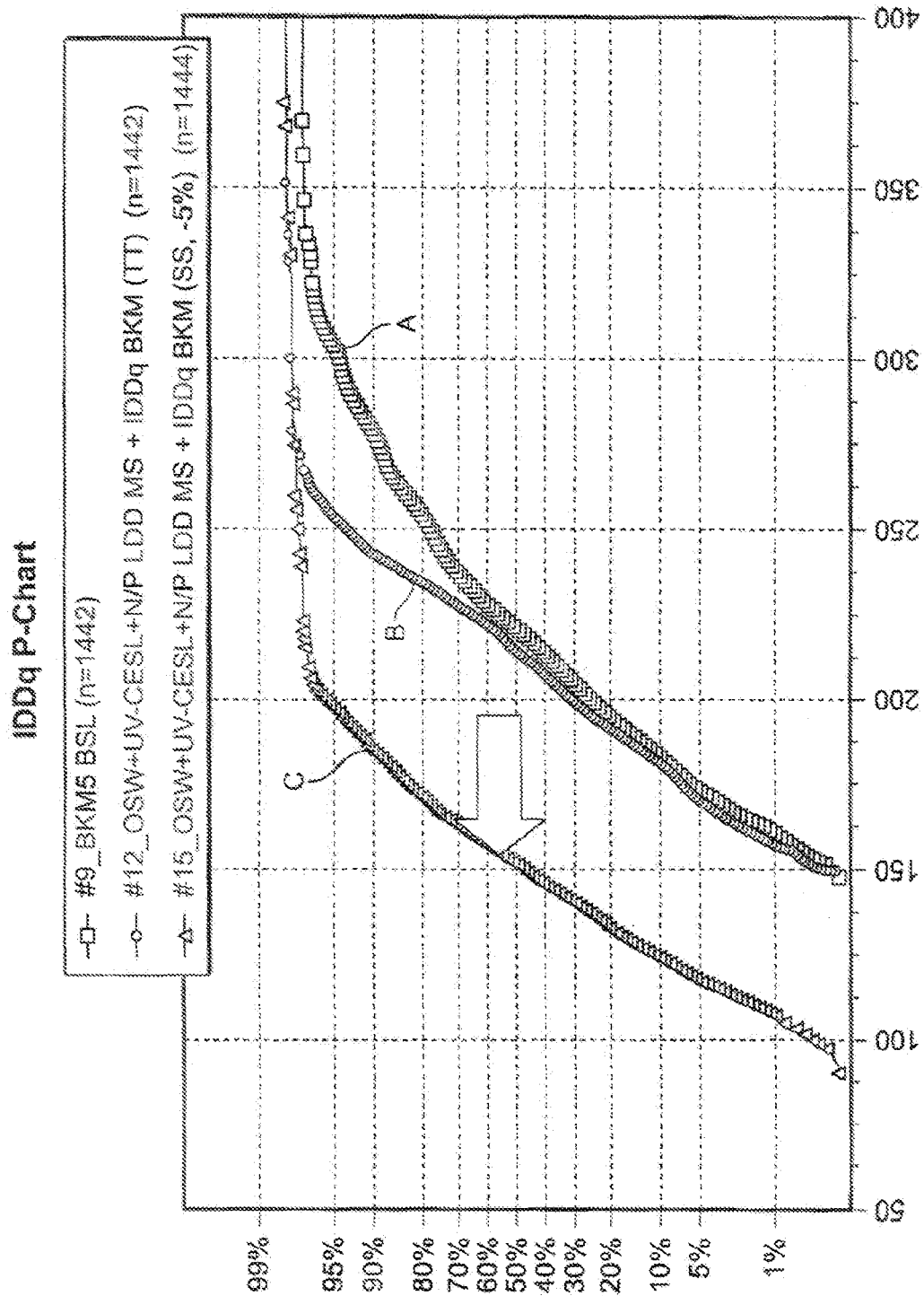

FIG. 6 is another cumulative percentage graph of Iddq and compares one baseline product labeled A (i.e., a product formed using the standard single implantation step) against the same product but formed using the multi-step implantation process described herein. More specifically, the product results labeled C correspond to a product having LDD regions formed by a multi-step implant and designed for typical device performance. The product results labeled B correspond to a product having LDD regions formed by a multi-step implant and designed for faster device performance. As described above, the devices formed using the multi-step implantation method described herein have lower mean Iddq results and better Iddq distribution.

It should be understood that if the implantation process required multiple species, such as first, second and third species at respective implant energies and at respective target dosages $X_T$, $Y_T$, and $Z_T$, the multi-step implant process described herein uses the same species and implant energies but at multiple smaller individual implantation dosages, i.e., $X1+X2+X3 \ldots +Xn=X_T$; $Y1+Y2+Y3 \ldots +Yn=Y_T$; and $Z1+Z2+Z3 \ldots +Zn=Z_T$. Importantly, the basic manufacturing process and device design does not change. Rather, the same photoresist layer defining the implant regions are formed; the dopants are implanted; and the photoresist layer is removed.

Figure 7:
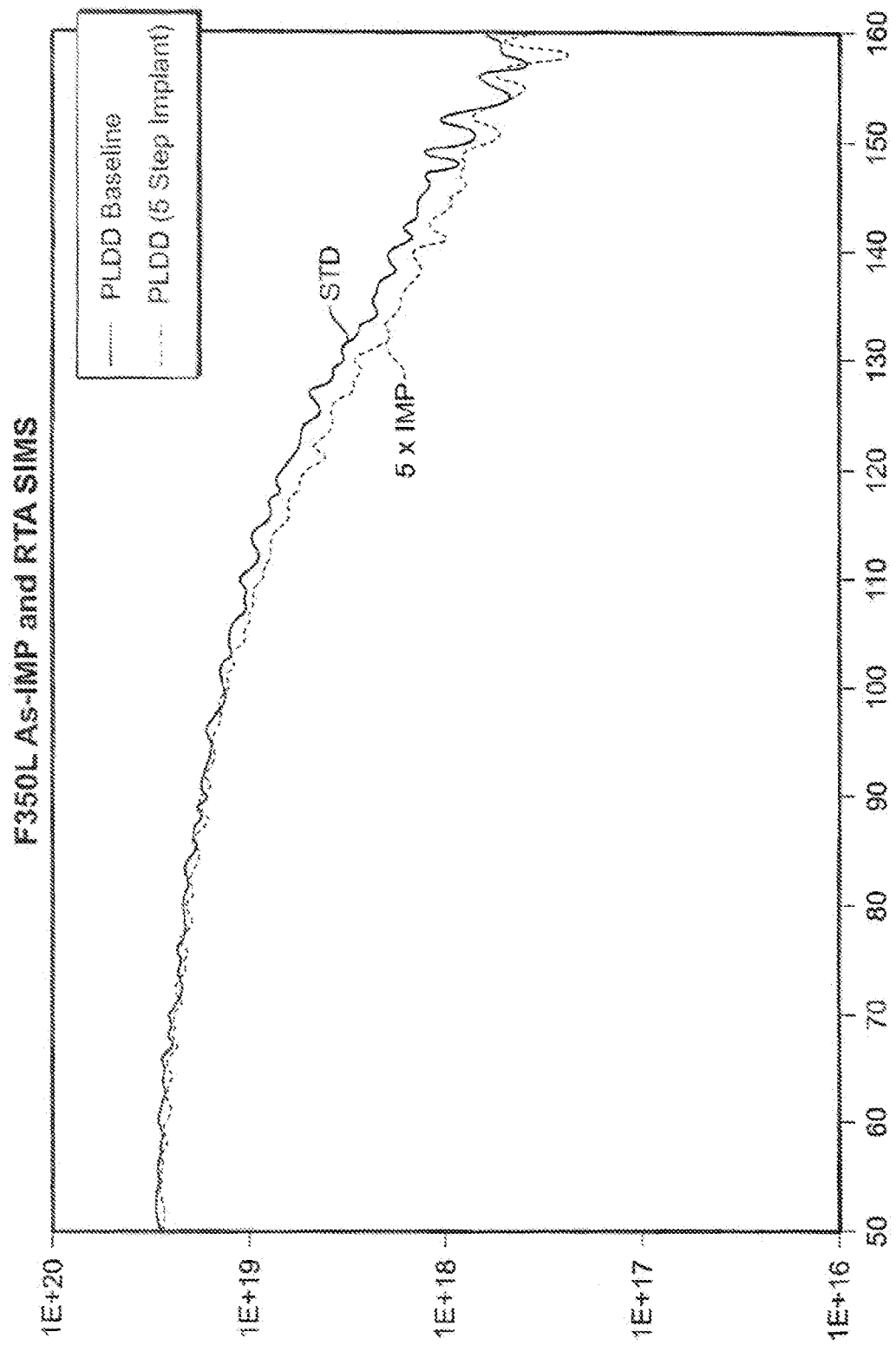

Last, FIG. 7 shows a graph of simulation data illustrating the silicon relaxation effect discussed above. The x-axis represents depth into the silicon substrate and the y-axis represents doping concentration. The graph shows a doping profile measured by SIMS (Secondary Ion Mass Spectrometer). The profile shows more abrupt junction and better dopant activation (near peak distribution) formed by the multi-step implant process described herein. It should be emphasized that conventional implant process tuning methods (e.g. Changing implant energy/dosage) cannot, achieve both, i.e., there is usually a "trade-off" between a shallower/abrupt junction and dopant activation. As is shown in the graph, the results for the device formed using the multi-step implant process described herein illustrate reduced TED.

As described above, an improved method for forming a dopant implant regions in a MOS transistor device is presented. The method utilizes at least two individual implantations to implant the target dopant concentration into a region of a semiconductor substrate. In some embodiments, the wafer is unloaded and then reloaded into the processing chamber in between implantations, and without annealing the wafer in between each implantation. Results were more pronounced for devices having LDD regions formed using the multi-step implant process, and still more pronounced for devices having p-doped LDD regions. Devices formed using the implant process showed improvements in Iddq, Iddq uniformity and device speed at a given Iddq.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A method of forming a dopant implant region in a MOS transistor device, the dopant implant region having a dopant profile having a target dopant concentration, the method comprising the steps of:
    implanting a first concentration of dopants into a region of a substrate, said first concentration of dopants being less than said target dopant concentration; and
    without annealing the substrate after said implanting step, performing at least one second implanting step to implant at least one second concentration of dopants into the region of the substrate to bring the dopant concentration in the region to said target dopant concentration, wherein the implanting steps are performed in an implantation chamber of an implantation tool, the method further comprising the steps of unloading the substrate from the implantation chamber and then reloading the substrate into the implantation chamber in between said implanting steps.

2. The method of claim 1, wherein the method includes at least three implanting steps, with the sum of respective dopant concentrations from the at least three implanting steps providing said target dopant concentration, wherein the unloading and reloading steps are performed in between successive implanting steps.

3. The method of claim 2, wherein the method includes 3-5 of said implanting steps.

4. A method of forming a dopant implant region in a MOS transistor device, the dopant implant region having a dopant profile having a target dopant concentration, the method comprising the steps of:
    implanting a first concentration of dopants into a region of a substrate in an implantation chamber of an implantation tool;
    after said implanting step, unloading the substrate from said implantation chamber and then reloading the substrate in said implantation chamber; and
    after said reloading step, performing at least one second implanting step using said implantation tool to implant at least one second concentration of dopants into the region of the substrate to bring the dopant concentration in the region to said target dopant concentration.

5. The method of claim 4, wherein the dopant profile is associated with an implant energy setting, wherein the first concentration of dopants and at least one second concentration of dopants are implanted at said implant energy setting.

6. The method of claim 4, wherein the method includes at least three implanting steps, with the sum of respective dopant concentrations from the at least three implanting steps providing said target dopant concentration, wherein the unloading and reloading steps are performed in between successive implanting steps.

7. The method of claim 6, wherein the method employs 3-5 implanting steps.

8. The method of claim 4, wherein the substrate is not annealed in between implanting steps.

9. The method of claim 4, wherein the MOS implant region is the lightly doped drain (LDD) implant portion of a source/drain implant region of the MOS transistor device, wherein the MOS transistor device has a smaller gate-to-LDD implant overlap compared to the gate-to-LDD implant overlap of a device with its LDD implant region formed using a single implanting step to implant said target dopant concentration using the same implant energy.

10. A method of forming a dopant implant region in a MOS transistor device, the dopant implant region having a dopant profile having a target dopant concentration, the method comprising the steps of:
    in an implantation chamber, performing multiple implanting steps, each at the same implantation energy setting and using the same dopant species, to implant dopants into a region of a semiconductor substrate until the dopant concentration of said region reaches said target dopant concentration, each implanting step implanting a respective dopant concentration that is less than said target dopant concentration; and
    exposing said semiconductor substrate to the ambient environment outside of the implantation chamber in between each implanting step.

11. The method of claim 10, wherein the exposing step includes the steps of unloading the substrate from the implantation chamber and then reloading the substrate into the implantation chamber.

12. The method of claim 10, wherein the multiple implanting steps include at least three implanting steps.

13. The method of claim 10, wherein the substrate is not annealed in between any of said multiple implanting steps.

14. The method of claim 10, wherein the MOS implant region is the lightly doped drain (LDD) implant portion of a source/drain implant region of the MOS transistor device, wherein the MOS transistor device has a smaller gate-to-LDD implant overlap compared to the gate-to-LDD implant overlap of a device with its LDD implant region formed using a single implanting step to implant said target dopant concentration using the same implantation energy.

15. The method of claim 14, wherein the LDD implant portion is doped with P-type dopants.

16. The method of claim 10, wherein the multiple implanting steps includes at least first and second implanting steps, wherein the exposing step include, in between said first and second implanting steps:
    unloading said semiconductor wafer from said implantation chamber;
    loading a second semiconductor wafer into said implantation chamber for processing;
    unloading said second semiconductor wafer from said implantation chamber; and
    reloading said first semiconductor wafer into said implantation chamber.

* * * * *

UNITED STATES PATENT AND TRADEMARK OFFICE
CERTIFICATE OF CORRECTION

| | | |
|---|---|---|
| PATENT NO. | : 8,008,158 B2 | Page 1 of 1 |
| APPLICATION NO. | : 12/170656 | |
| DATED | : August 30, 2011 | |
| INVENTOR(S) | : Tse-En Chang et al. | |

It is certified that error appears in the above-identified patent and that said Letters Patent is hereby corrected as shown below:

Column 1, Line 11, delete "an" and insert -- on -- therefor.

Column 2, Line 4, delete "remaking" and insert -- remaining -- therefor.

Column 2, Line 13, delete "charmed" and insert -- channel -- therefor.

Column 3, Line 19, delete "depart" and insert -- dopant -- therefor.

Column 3, Line 55, delete the second occurrence of "implantation" and insert -- implantations -- therefor.

Column 4, Line 44, delete "require" and insert -- required -- therefor.

Column 4, Line 66, delete "entreat" and insert -- current -- therefor.

Column 5, Line 17, delete "e,g." and insert -- e.g. -- therefor.

Column 6, Line 5, delete "PLLD" and insert -- PLDD -- therefor.

Column 6, Line 39, delete "required" and insert -- requires -- therefor.

Column 6, Line 58, delete "," after "cannot".

Signed and Sealed this
Third Day of January, 2012

David J. Kappos
*Director of the United States Patent and Trademark Office*